(12) United States Patent
Wang et al.

(10) Patent No.: US 7,071,544 B2
(45) Date of Patent: Jul. 4, 2006

(54) WAFER LEVEL ASSEMBLY PACKAGE

(75) Inventors: Chi-Yu Wang, Kaohsiung (TW); Tai-Yuan Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 136 days.

(21) Appl. No.: 10/747,055

(22) Filed: Dec. 30, 2003

(65) Prior Publication Data
US 2004/0150119 A1    Aug. 5, 2004

(30) Foreign Application Priority Data
Dec. 31, 2002   (TW) .............................. 91138173 A

(51) Int. Cl.
*H01L 23/02*   (2006.01)

(52) U.S. Cl. ..................................................... 257/678
(58) Field of Classification Search ................. 257/678
See application file for complete search history.

(56) References Cited

U.S. PATENT DOCUMENTS 6,326,698 B1 *  12/2001  Akram ........................ 257/781
6,787,903 B1 *   9/2004  Yang ........................... 257/734

FOREIGN PATENT DOCUMENTS

TW              506050         11/1989

* cited by examiner

*Primary Examiner*—Douglas W Owens
(74) *Attorney, Agent, or Firm*—Bacon & Thomas, PLLC

(57) ABSTRACT

A wafer level package mainly comprises a semiconductor wafer and a plurality of bonding pads disposed on the active surface of the wafer. It is characterized in that there is a protection layer formed on the back surface of the wafer, wherein the wettability of the solder material with the protection layer is lower than the wettability of the solder material with the bonding pads. In such a manner, the protection layer will prevent the back surface of the wafer from being contaminated with the solder material. Moreover, when a UBM layer is further provided on the bonding pad, the wettability of the solder material with the protection layer is lower than the wettability of the solder material with the UBM layer.

14 Claims, 4 Drawing Sheets

US 7,071,544 B2

WAFER LEVEL ASSEMBLY PACKAGE

BACKGROUND OF THE INVENTION

1. Field of Invention

This invention relates to a wafer level assembly package. More particularly, the present invention is related to a wafer level assembly package having a wafer with a protection layer formed on the back surface thereof.

2. Related Art

As shown in FIG. 1, it illustrates an enlarged portion of a conventional semiconductor wafer 10. Generally speaking, said semiconductor wafer 10 has a back surface 102, an active surface 104 and a plurality of bonding pads 106 formed on the active surface 104. The wafer level assembly package is formed by the steps of forming an under-bump-metallurgy (UBM) layer 12 on the bonding pad 106, forming a solder bump 14 on the UBM layer 12 and reflowing the solder bump 14 to secure to the UBM layer 12 as show in FIG. 2. Referring to FIG. 3, usually, a thermally conductive layer 18, for example a metal layer, is formed on the back surface 102 of the semiconductor wafer 10 for thermal enhance. Afterwards, a laser is performed to form a melted portion 182 and an un-melted portion 184. In such a manner, a logo is formed on the back surface 102 of the semiconductor wafer 10 due to the contrast between the melted portion 182 and the un-melted portions 184.

However, the solder material has a good wettability with the metal layer. Specifically, the solder material has a better wettability with the gold metal layer. Accordingly, when the solder bump 14 is formed on the active surface 104, the excessive solder material is reacted with the gold metal layer 18 formed on the back surface 102 so as to make the solder material located on the back surface 102 of the wafer 10 and cause the back surface 102 to be easily contaminated. In addition, the logo is formed by laser marking the metal layer on the back surface. However, the contrast between the melted portions and un-melted portions is not apparent, so the logo is not well identified.

Therefore, providing another assembly package to solve the mentioned-above disadvantages is the most important task in this invention.

SUMMARY OF THE INVENTION

In view of the above-mentioned problems, an objective of this invention is to provide a wafer level assembly package having a semiconductor wafer with a protection layer formed on the back surface thereof so as to prevent the back surface from being contaminated. Therein, the protection layer is made of a material which has a low wettability for wetting with the solder material.

To achieve the above-mentioned objective, a wafer level assembly package is provided, wherein said wafer level assembly package mainly comprises a semiconductor wafer and a plurality of solder bumps formed on the active surface of the wafer. It is characterized in that a protection layer is further formed on the back surface of the wafer, wherein the protection layer is made of a material having low wettability with solder material, for example titanium-nitride layer. In such a manner, the back surface of the wafer can be prevented from being contaminated. Specifically, the wettability of the protection layer with the back surface is lower than the wettability of the bonding pad or UBM layer with the solder material. Namely, it is more difficult to form intermetallic compound (IMC) by the protection layer being reacted with the solder material. Besides, the titanium-nitride layer is golden in color in general. Accordingly, the contrast between the melted portions and the un-melted portions is apparent, so the logo will be well identified.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The wafer level assembly package according to the preferred embodiment of this invention will be described herein below with reference to the accompanying drawings, wherein the same reference numbers refer to the same elements.

Figure 1:
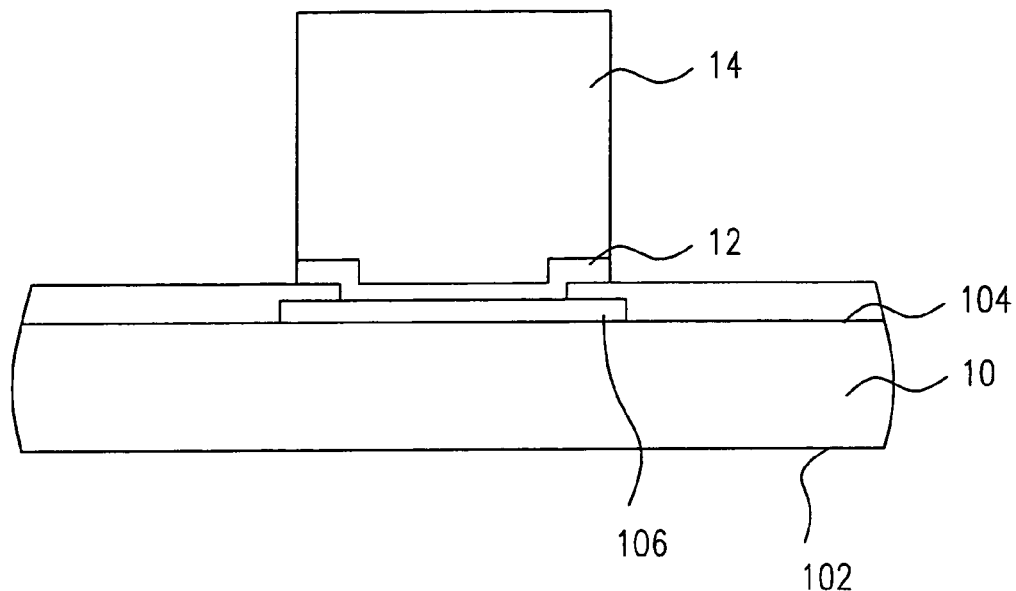
FIG. 1 is a cross-sectional view of an enlarged portion of the conventional wafer with a solder bump before performing a reflowing process.
Figure 2:
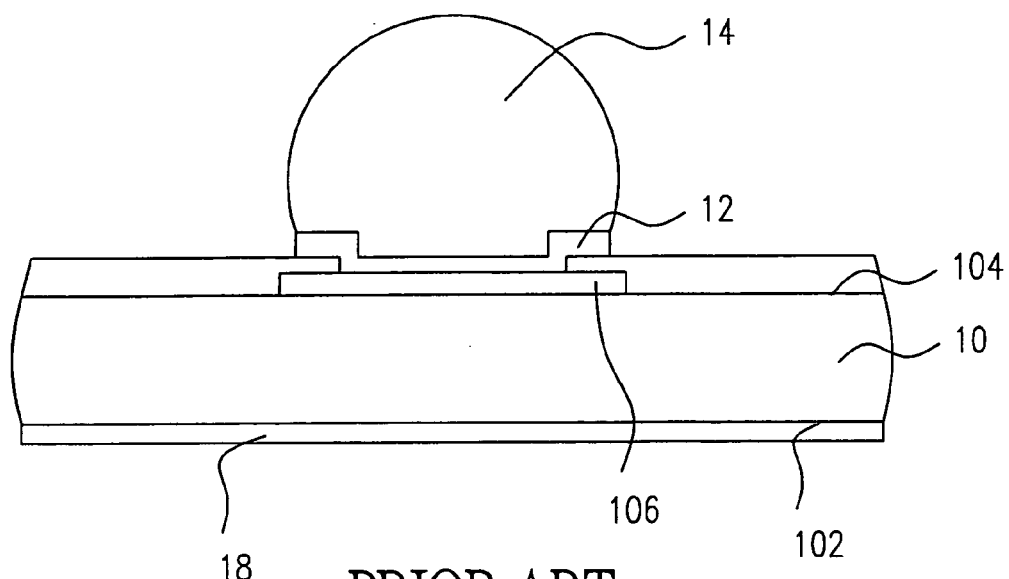
FIG. 2 is a cross-sectional view of an enlarged portion of the conventional wafer with a solder bump after performing a reflowing process.
Figure 3:
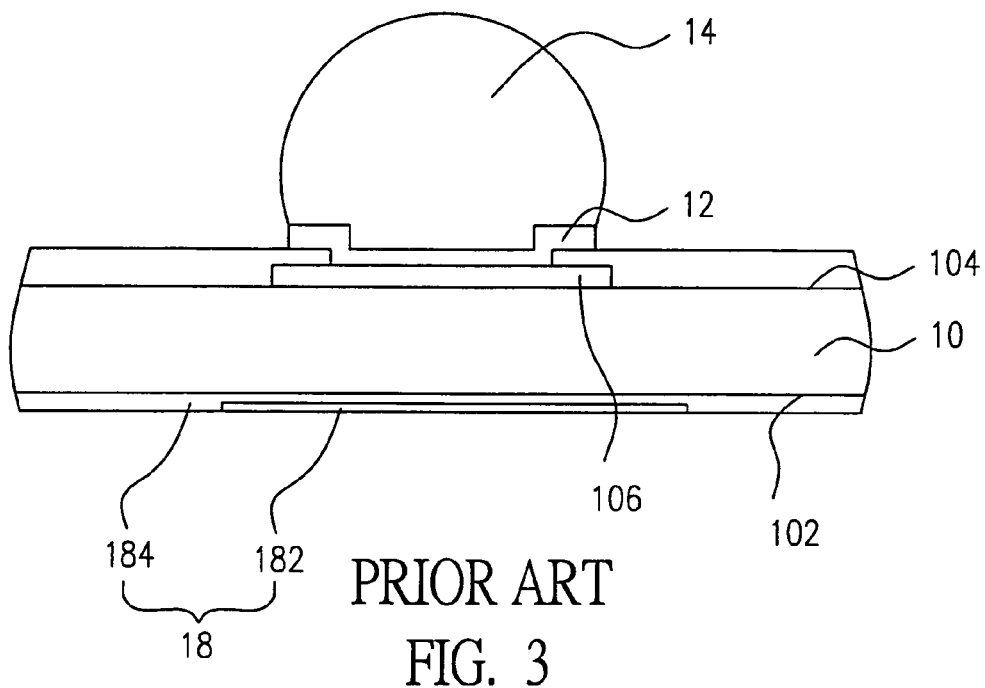
FIG. 3 is a cross-sectional view of an enlarged portion of the conventional wafer with a thermally conductive layer having a logo formed thereon after performing a laser ablation process.
Figure 4:
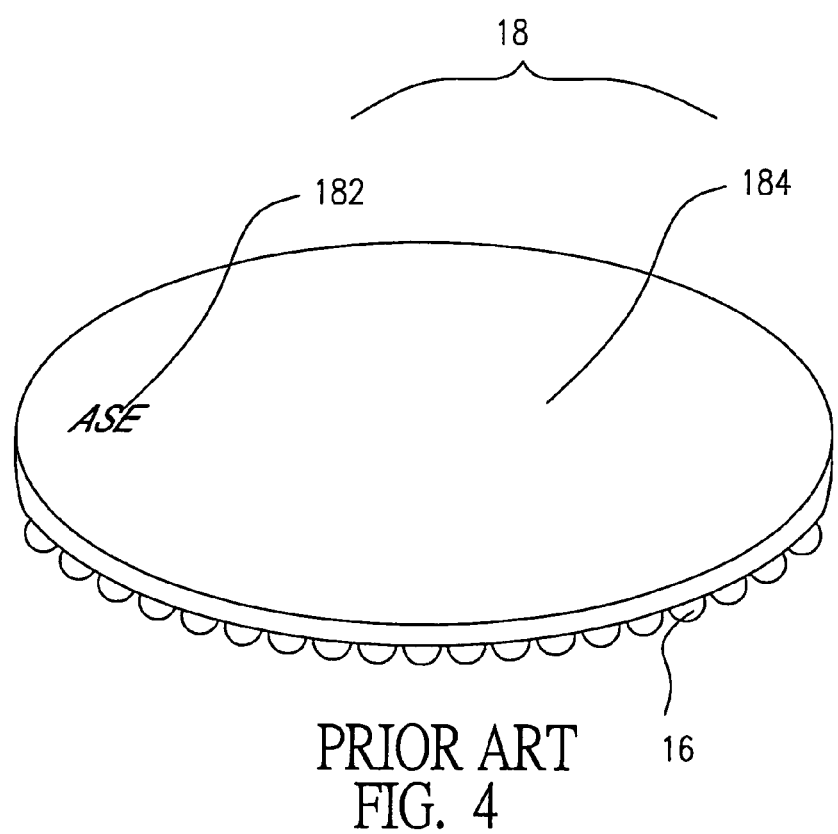
FIG. 4 is a top view of an enlarged portion of the conventional wafer with a thermally conductive layer having a logo formed thereon after performing a laser ablation process.
Figure 5:
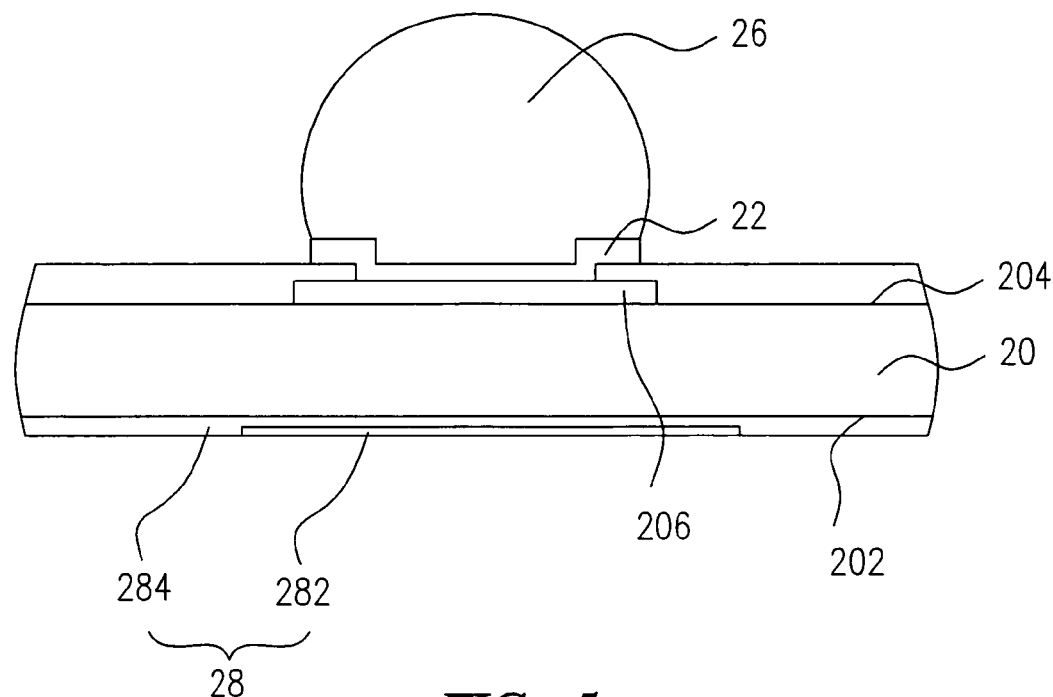
FIG. 5 is a cross-sectional view of an enlarged portion of the wafer level assembly package according to this invention.
Figure 6:
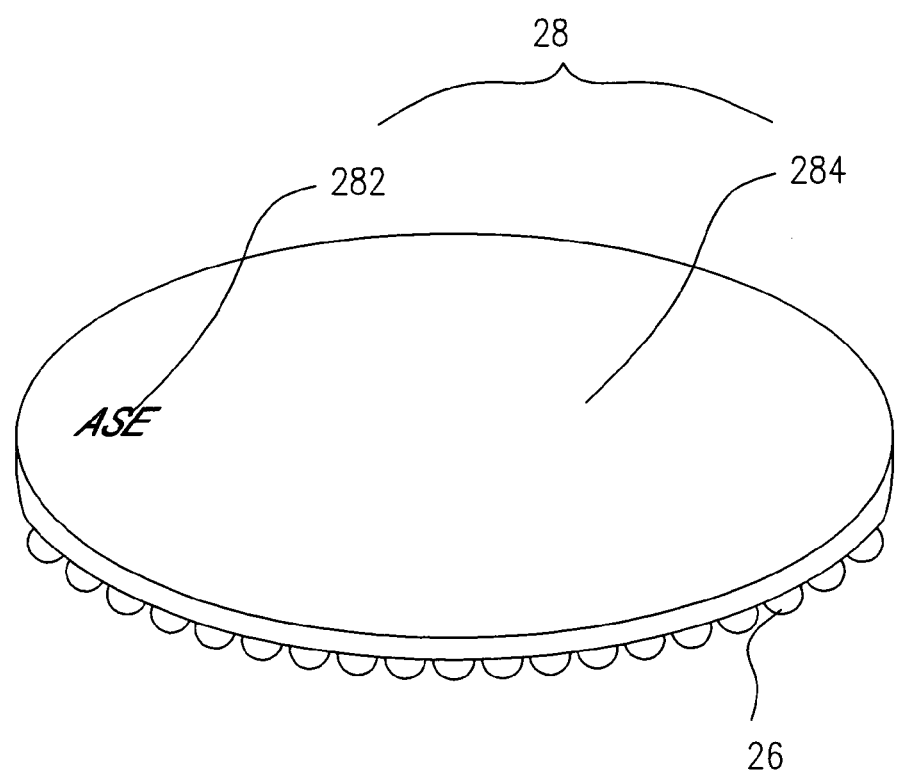
FIG. 6 is a top view of an enlarged portion of the protection layer formed on the back surface of the wafer according to FIG. 5.
Figure 7:
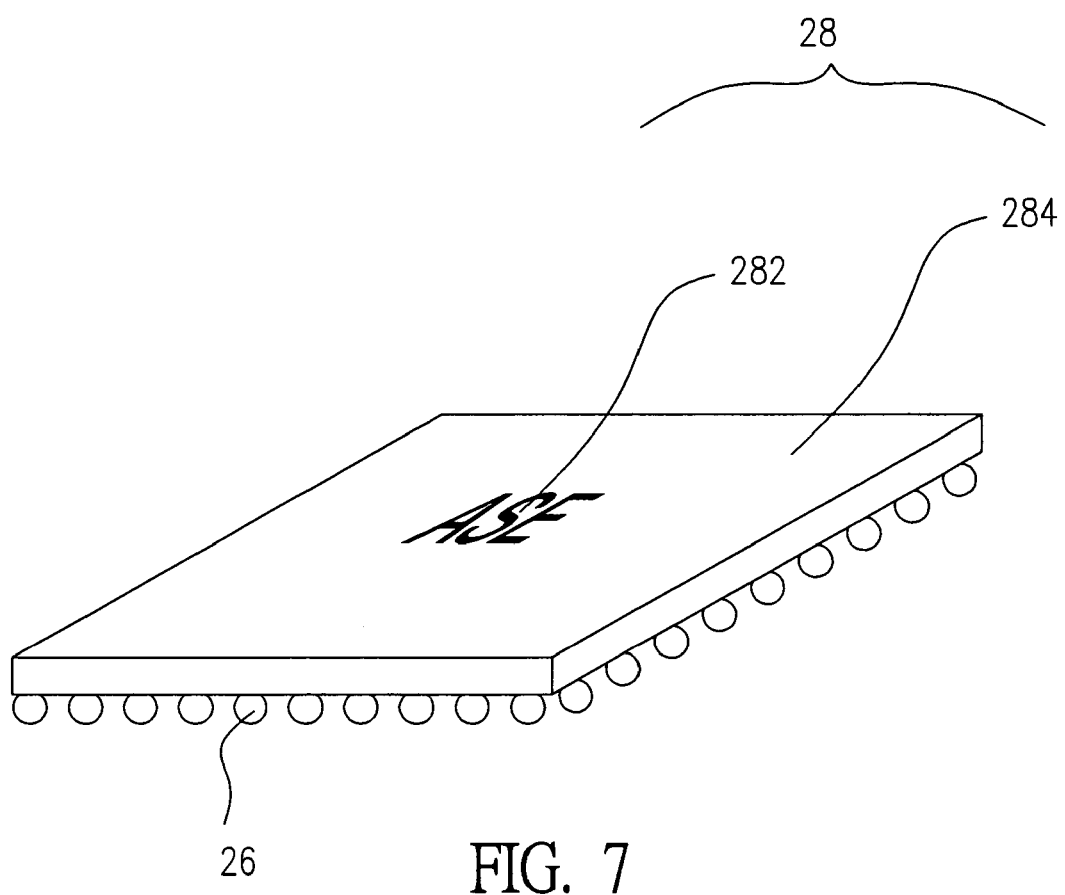
FIG. 7 is a top view of the protection layer formed on a back surface of a chip.

In accordance with a preferred embodiment as shown in FIG. 5, there is provided a wafer level assembly package. Therein, said wafer level assembly package at least comprises a wafer 20, a plurality of solder bumps 26 and a protection layer 28. Said wafer 20 has an active surface 204 and a plurality of bounding pads 206 formed on the active surface 204. In addition, there is an under-bump-metallurgy (UBM) layer 22 formed on the bonding pad 206 and said UBM layer comprises an adhesive layer a barrier layer and a wetting layer interposed between solder bumps 26 and bonding pads 206. For copper bonding pad, said UBM layer 22 may comprise a titanium layer, a nickel-vanadium layer and a copper layer. For aluminum bonding pad, said UBM layer 22 may comprises an aluminum layer, a nickel-vanadium layer and a copper layer. Therein, the titanium layer or the aluminum layer can be taken as adhesive layer; the nickel-vanadium layer may be treated as barrier layer; and the copper layer may be regarded as wetting layer for adhering to solder bumps. As mentioned above, the solder bump 26 are made of solder material and solder material comprises tin. Moreover, the protection layer 28 is disposed on the back surface 202 of the wafer 20. Specifically, the protection layer 28 is made of titanium-nitride (TiN) to replace original gold layer. For example, the wettability between titanium-nitride layer and solder material is bad so as to prevent the solder material from being adhered to the back surface 202 of the wafer 20. Namely, the wettability of the solder material with the back surface 202 of the wafer 20 shall be lower than the wettability of the solder material with the UBM layer 22 or the boning pad 206. Besides, the titanium-nitride layer can be formed by disposing the wafer 20 in a chamber filled with argon to prevent the titanium plate from being oxidized, bombarding the titanium plate by the ion generated from plasma so as to cause the titanium atom disposed on the back surface of the wafer, and providing nitrogen air to fill with said chamber so as to have the titanium atom reacted with nitrogen atom. Finally, titanium-nitride (TiN) layer is formed on the back surface 202 of the wafer 20.

Moreover, as mentioned above, the titanium-nitride (TiN) layer is golden in color, so the melted portion 282 and the un-melted portion 284 will be easily and well identified due to apparent contrast between melted portions and un-melted portions after forming a logo on the titanium-nitride (TiN) layer by performing laser marking process.

In addition, the semiconductor wafer 20 of said wafer level assembly package can be separated into a plurality of chips before forming the protection layer 28 on the back surface 202 of the wafer 20 and forming a logo on said protection layer 28 by performing laser marking process. Moreover, said separated chips can be bonded to the substrate by flip chip technology to from a flip chip package having a chip with a marking logo 282 on back surface 28 of said chip by the manufacturing process as mentioned above.

Although the invention has been described in considerable detail with reference to certain preferred embodiments, it will be appreciated and understood that various changes and modifications may be made without departing from the spirit and scope of the invention as defined in the appended claims.

What is claimed is:

1. A wafer level assembly package, comprising:
   a semiconductor wafer having an active surface, a back surface and a plurality of bonding pads formed on the active surface;
   a plurality of bumps disposed above the bonding pads, wherein the bumps are made of a solder material and wherein an under-bump-metallurgy layer is interposed between one of the bonding pads and the corresponding bump; and
   a protection layer formed on the back surface, wherein the wettability of the solder material with the protection layer is lower than the wettability of the solder material with the under-bump-metallurgy layer.

2. The wafer level assembly package of claim 1, wherein an under- bump-metallurgy layer is interposed between one of the bonding pads and the corresponding bump.

3. The wafer level assembly package of claim 1, wherein the protection layer is made of titanium-nitride.

4. The wafer level assembly package of claim 1, wherein the under-bump-metallurgy layer comprises an adhesive layer, a barrier layer and a layer.

5. The wafer level assembly package of claim 4, wherein the adhesive layer is made of aluminum.

6. The wafer level assembly package of claim 4, wherein the adhesive layer is made of titanium.

7. The wafer level assembly package of claim 4, wherein the barrier layer is made of titanium-vanadium.

8. The wafer level assembly package of claim 4, wherein the wetting layer is made of copper.

9. The wafer level assembly package of claim 1, wherein the protection layer comprises a melted portion and an un-melted portion.

10. The wafer level assembly package of claim 1, wherein the semiconductor wafer comprises a plurality of chips.

11. A semiconductor device, comprising:
    a chip having an active surface, a back surface and a plurality of bonding pads formed on the active surface;
    a plurality of bumps disposed on the bonding pads, wherein the bumps are made of a solder material and wherein an under-bump-metallurgy layer is interposed between one of the bonding pads and the corresponding bump; and
    a protection layer formed on the back surface, wherein the wettability of the solder material with the protection layer is lower than the wettability of the solder material with the under-bump-metallurgy layer.

12. The semiconductor device of claim 11, wherein the wettability of the solder material with the protection layer is lower than the wettability of the solder material with the bonding pads.

13. The semiconductor device of claim 11, wherein the protection layer is made of titanium nitride.

14. The semiconductor device of claim 11, wherein the protection layer comprises a melted portion and an un-melted portion.

* * * * *